United States Patent [19]

Muller

[11] Patent Number: 4,564,922
[45] Date of Patent: Jan. 14, 1986

[54] POSTAGE METER WITH POWER-FAILURE RESISTANT MEMORY

[75] Inventor: Arno Muller, Westport, Conn.

[73] Assignee: Pitney Bowes Inc., Stamford, Conn.

[21] Appl. No.: 542,225

[22] Filed: Oct. 14, 1983

[51] Int. Cl.⁴ .......................... G06F 13/00; G06F 7/04
[52] U.S. Cl. ................................................... 364/900
[58] Field of Search ... 364/200 MS File, 900 MS File, 364/464, 466

[56] References Cited

U.S. PATENT DOCUMENTS

| | | | |
|---|---|---|---|
| 4,169,288 | 9/1979 | Fairman et al. | 364/900 |
| 4,218,764 | 8/1980 | Furata et al. | 365/222 |
| 4,247,918 | 1/1981 | Iwahashi et al. | 365/218 |
| 4,279,024 | 7/1981 | Schrenk | 365/203 |
| 4,285,050 | 8/1981 | Muller | 364/900 |
| 4,306,299 | 12/1981 | Check, Jr. et al. | 364/900 |
| 4,327,410 | 4/1982 | Patel et al. | 364/200 |
| 4,484,307 | 11/1984 | Quatse et al. | 364/900 |

*Primary Examiner*—Harvey E. Springborn
*Attorney, Agent, or Firm*—David E. Pitchenik; Albert W. Scribner; William D. Soltow, Jr.

[57] ABSTRACT

A security system for a postage meter includes two memories, one of which is an electronically programmable READ-ONLY memory having non-volatile storage, while the second memory is a shadow RAM which is a composite memory having a first section composed of a volatile RAM and a second section composed of non-volatile storage. During a power outage, a computer strobes the second memory to transfer data from the volatile section to the non-volatile section. Upon restoration of the power, a transfer circuit which includes a detector of the incoming power directs the transfer of at least a portion of the stored data in each of the memories to the computer for a comparison to determine if any data has been altered by the loss of power.

5 Claims, 4 Drawing Figures

POSTAGE METER WITH POWER-FAILURE RESISTANT MEMORY

BACKGROUND OF THE INVENTION

This invention relates to the use of memories in electronic postage meters and, more particularly, to the use of multiple forms of memory including the instantaneous transfer from volatile to non-volatile memory for protection of information during power failure.

Electronic postage meters may incorporate a computer, typically a microcomputer or microprocessor, to provide a variety of functions. These functions include, among others, a tally of postage costs and remaining postage already paid for; the number of mail pieces which have been stamped; maintenance of the proper date; and similar functions useful in the processing of mail. Such computers are utilized with memories which store original data, such as the amount of postage originally paid for, and new data, such as the current amount of postage utilized. The program by which the computer is operated is also stored.

In the use of memories, a distinction is made between live or volatile memories, wherein stored data can be continually changed, and fixed or non-volatile memories wherein data can be stored permanently, independently of the presence of electric power. The live memory is employed continuously in the computer operations, particularly in arithmetic operations. The fixed memory may be used for storage of results of the computations as well as for storage of the program.

A problem arises in that with present day techniques in the construction of memories, the volatile memory can retain its stored data only by the use of continuous electric power inputted to the memory. In the event of power failure, the data is lost. The random-access memory (RAM) is one such memory. In contrast, the fixed memory, such as the read-only memory (ROM) or electrically eraseable and programable ROM (EEPROM), retains its stored data even without electric power. However, only the EEPROM is suitable for storage of alterable data. Unfortunately, EEPROMs at the present time are slow and have a limited life. This makes it impractical to use an EEPROM instead of RAM for the storage of variable data except when it is necessary to preserve such data after power is turned off.

SUMMARY OF THE INVENTION

The foregoing problem is overcome, and other advantages are provided, by an electronic postage meter incorporating a computer, such as a microprocessor or microcomputer, for the computation of available postage and similar functions relating to the processing of postage. The postage meter further includes an EEPROM or ROM, which stores programs for the computer, and an additional EEPROM and shadow RAM for the storage of alterable data. In accordance with the invention, the stored data is protected by a security system which is able to maintain the data, even in the presence of a power failure.

The security system comprises a shadow RAM which is a composite memory unit including a first section which is structured as a volatile RAM and a second section which is structured as a non-volatile array of storage cells arranged in correpondence with the cells of the RAM. The composite unit may be fabricated as a monolithic semi-conductor structure with a region disposed between the two sections which transfers data simultaneously between corresponding cells of the two sections upon activation of a suitable electric strobe. The strobe signals are in the form of digital logic signals which can command the transfer of data from the volatile to the non-volatile section during a power loss and return the data back to the volatile portion upon restoration of the power.

In addition, the security system includes a transfer circuit which is responsive to the presence and absence of power for generating the strobe signals for operation of the composite memory. The computer is responsive to a signal of the transfer circuit for comparing the data stored in the shadow RAM and the EEPROM upon restoration of power after a power failure. If the data is found to agree, then there has been a successful transfer of stored data between the volatile and non-volatile portions of the composite memory. In this case, normal operation of the postage meter may be safely resumed upon the restoration of electric power. In the event that there is a disparity between the data stored in the shadow RAM and in the EEPROM, the computer signals a fault, at which time the postage meter shuts down to allow a person using the postage meter to take remedial action.

BRIEF DESCRIPTION OF THE DRAWING

The aforementioned aspects and other features of the invention are explained in the following description, taken in connection with the accompanying drawings wherein.

DETAILED DESCRIPTION

Figure 1:
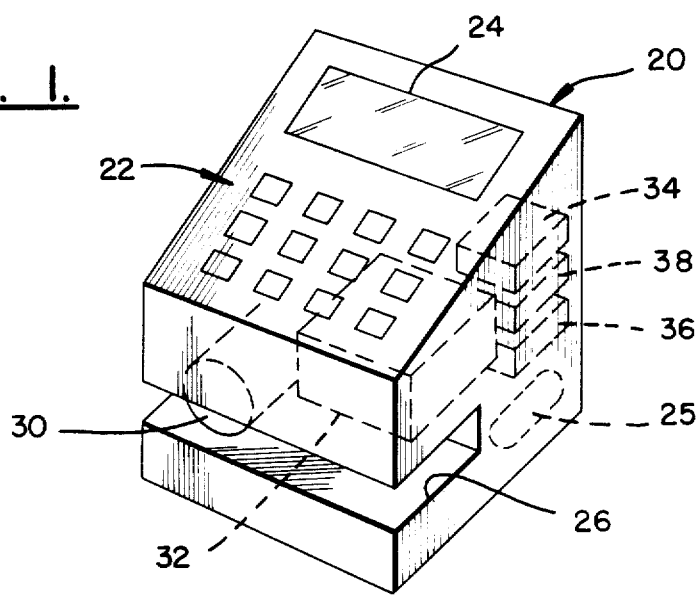
FIG. 1 is a stylized view of an electronic postage meter, with electronic components thereof being shown in phantom.
Figure 2:
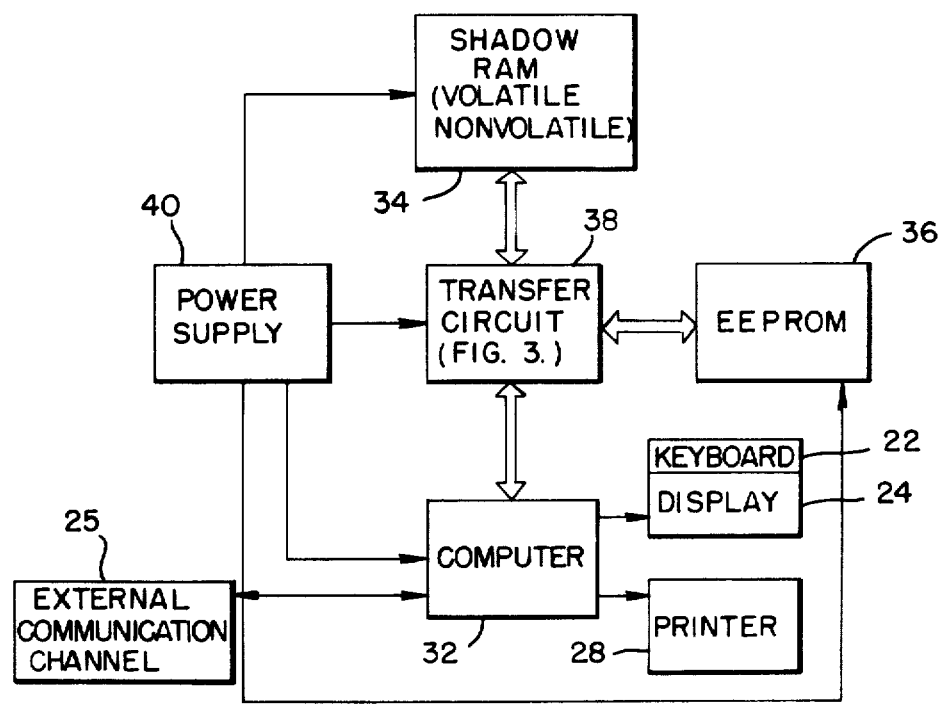
FIG. 2 is a block diagram showing the interconnection among electronic components of the postage meter of FIG. 1.

With reference to FIGS. 1 and 2, there is shown an electronic postage meter 20 having an optional keyboard 22 for the entry of data and the selection of functions to be performed by the meter 20. The data entered by the keyboard 22 appears on an optional display 24. The entry of data and selection of functions as well as the conveying of information from the meter can be accomplished also via an external communication channel 25. A slot 26 is provided for the passage of mailpieces which are to receive postage which is imprinted by a printer 28, the printer 28 including a print drum 30 having type (not shown) which presses against the mailpieces as a path along the slot 26.

The postage meter 20 further comprises a computer 32, a shadow RAM memory 34, an EEPROM 36, and a transfer circuit 38 for directing the transfer of data between the computer 32 and the memories 34 and 36, in accordance with the invention, as will be described subsequently. A power supply 40 provides electric power for the operation of the computer 32 and the memories 34 and 36. The computer 32, the memories 34 and 36 and the transfer circuit 38 are shown in phantom view in FIG. 1 with the connections therebetween being shown in the block diagram of FIG. 2.

In operation, data provided by the keyboard 22 may be entered into the shadow RAM memory 34 and the EEPROM 36, depending on the function selected by the keyboard 22. In this particular implementation of the invention, a single chip microcomputer is used. This microcomputer includes, besides the microprocessor, its own ROM or EEPROM for the storage of the program and RAM for storage of data used for implementation of the program. Computations by the computer 32 appear on the display 24. In response to a sensing of the presence of a mailpiece in the slot 26, and in response to an enabling signal provided by the computer 32, the printer impresses the requisite postage on a mailpiece.

In accordance with a feature of the invention, the composite memory is composed of two sections, the first section being structured as a volatile random-access memory (RAM), while the second section is structured as a volatile array of storage cells arranged in correspondence with the cells of the RAM. The two sections are aligned with each other and spaced apart by a region of semi-conductor material which is structured for the transfer of data from the first section to the second section in response to a strobe or logic signal of a first logic state, the data being transferred from the second section back to the first section in response to the logic signal having the opposite state.

The data is transferred simultaneously from all of the cells of one section to the corresponding cells of the second section in response to the strobe signal. The first section, configured as a RAM, provides for the rapid exchange of data between the computer 32 and the memory 34 while the second section provides for the permanent non-volatile storage of data, which storage can be maintained independently of the presence of electric power. One such memory is commerically available today as an integrated circuit from XICOR identified as part X2112.

In accordance with a further feature of the invention, additional security is provided in the case of a power failure by the storage of data in the EEPROM 36. Thus, the EEPROM 36 stores a portion of the data, such as the original amount of postage paid for, which data is also stored within the memory 34. Since the EEPROM 36 is a non-volatile memory, the data stored therein remains intact, even in the absence of electric power. Thus, there are two storage areas wherein data is retained during the absence of electric power, namely, the EEPROM 36 and the second section of the composite memory 34. By use of the two non-volatile memories, the data stored therein can be compared after power has been restored to insure that there has been no loss of data during a power failure.

The transfer circuit 38 includes a detector of the voltage supplied by the power supply 40. In the event that the voltage drops, as would occur during the initial stages of a power failure, the transfer circuit 38 strobes the memory 34 to transfer the data from the RAM of the first section to the non-volatile storage of the second section. Upon detection of a restoration of the power, the transfer circuit 38 strobes the memory 34 to transfer the data from the non-volatile section to the RAM and also signals the computer 32 to initiate a comparison of the data stored within the RAM section of the memory 34 and the EEPROM 36. Upon attainment of a successful comparison, the computer 32 resumes its normal mode of operation in the meter 20. In the event that a faulty comparison is noted, the computer 32 shuts down, thereby shutting down the meter 20. Such a shutdown of the meter 20 is accompanied by an indication on the display 24, which indication is supplied by the computer 32.

Figure 3:
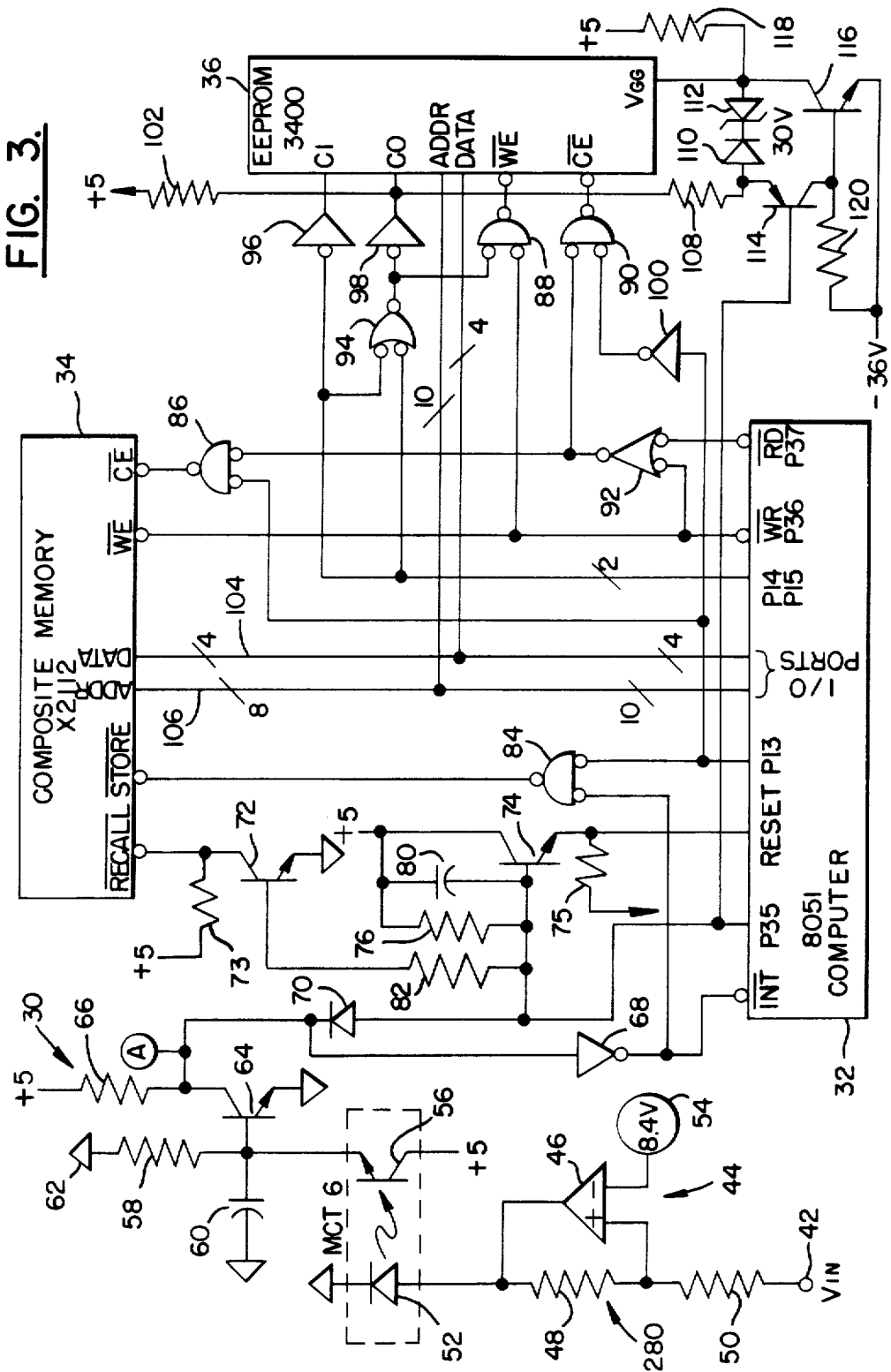
FIG. 3 is a schematic diagram of the transfer circuit of FIG. 2, the diagram showing the interconnection with the memories and a computer of FIG. 2.

FIG. 3 shows a schematic diagram of the transfer circuit 38 of FIGS. 1 and 2. FIG. 3 also shows the connections of the transfer circuit 38 with the computer 32, the EEPROM 36 and the composite memory 34. Input voltage from the power supply 40 is sensed at terminal 42.

The sensing of the input voltage at terminal 42 is accomplished by means of a detector 44 comprising an amplifier 46 with a feed-back resistor 48 and an input resistor 50 which couples the terminal 42 to an input terminal of the amplifier 46. The output terminal of the amplifier 46 connects with a photo-emitting diode 52. The output circuit of the amplifier 46 is of the open-collector form, and the resistors 48 and 50 provide a current path from terminal 42 to the diode 52. The amplifier 46 has a differential input with one input terminal being connected to a voltage-reference source 54 so that when the voltage at terminal 42 rises above the reference voltage the diode 52 emits light. When the voltage at 42 drops below the reference voltage, the light of the diode 52 is extinguished.

The transfer circuit 38 further comprises a photosensitive transistor 56 having a collector terminal connected to a source of voltage (provided by the power supply 40), with the emitter terminal being connected via a resistor 58 and a capacitor 60 to ground 62. The ground 62 serves as the return circuit for the power supply 40. Typically, the photo-emitting diode 52 and the photo-sensitive transistor 56 are supplied commercially in a single package wherein the light of the diode 52 is directed to a photo-sensitive surface of the transistor 56. The resistor 58 and the capacitor 60 provide a bias voltage for establishing the requisite operating point for the transistor 64, the bias voltage resulting from the voltage drop of emitter current flowing through the resistor 58.

The emitter terminal of the transistor 56 serves as its output terminal and is coupled to the base terminal of a transistor 64. The collector terminal of the transistor 64 is connected via a resistor 66 to the power supply voltage with the emitter terminal being coupled via a return circuit through ground to the power supply. The output voltage of the transistor 64 is taken at the collector terminal, identified by the legend A.

Figure 4:
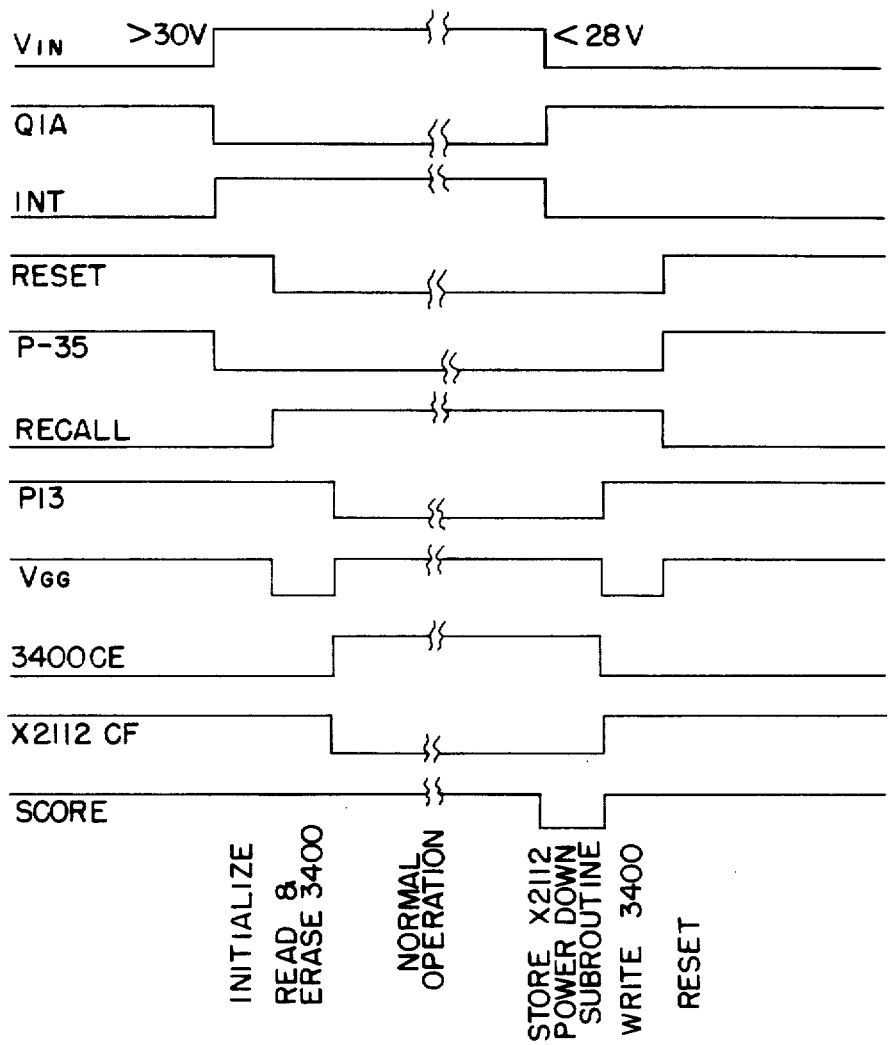
FIG. 4 is a timing diagram useful in explaining the waveforms of electric signals of the circuit of FIG. 3.

With reference also to the timing diagram of FIG. 4, the detector 44 and the transistors 56 and 64 operate as follows. In the presence of an input voltage at terminal 42 of appropriate magnitude, the diode 52 emits light which activates the transistor 56 to conduct current. The transistor 64 serves as an amplifier to provide power at terminal A, the waveform of the electric signal at terminal A being responsive to the magnitude of the input voltage at terminal 42 as shown in the first two traces of FIG. 4. Thus, as the input voltage rises above the determined level, an exemplary 30 volts being shown in FIG. 4, the voltage at terminal A drops from a relatively high voltage corresponding to the logic state of 1 to a relatively low voltage corresponding to a logic state of 0. During a power failure, when the input voltage at terminal 42 drops, the first two traces of FIG. 4 show that when the input voltage drops below a predetermined level, such as an exemplary 28 volts being shown in FIG. 4, the output voltage at terminal A rises from the logic 0 state back to the logic 1 state.

The signal at terminal A is applied to an inverter 68 and, via a diode 70, to two transistors 72 and 74. The diode 70 connects with the base terminal of the transistor 74 and, via resistor 82, to the base terminal of the transistor 72. Capacitor 80 is connected between the +5 V supply and the base terminal of the transistor 74. The output terminal of the inverter 68 is applied to the INTERRUPT terminal of the computer 32. The waveform at the INTERRUPT terminal appears in the third trace of FIG. 4, the waveform thereof being in temporal correspondence with the input voltage at terminal 42 (first trace of FIG. 4). The emitter terminal of the transistor 74 is connected with the RESET terminal of the computer 32 and resister 75 to ground. The waveform of the signal at the RESET terminal is shown in the fourth trace of FIG. 4 while the waveform at the anode terminal of the diode 70 (this being connected to Port 35 of the computer 32) is shown in the fifth trace of FIG. 4. The capacitor 80 provides for a charging current during the time the voltage is rising at the +5 V output of the power supply 40. This charging current provides base current for the operation of the transistor 74. The effect of this is shown in the fourth trace of FIG. 4 wherein the waveforms of the fourth and fifth trace are guaranteed to be in the high state initially.

The emitter terminal of the transistor 72 is grounded while the collector is coupled to the recall terminal of the memory 34 and the +5 V supply via Resistor 73, the collector of the transistor 74 being connected to the power supply while the emitter terminal of the transistor 74 is connected to the reset terminal of the computer 32 and ground via resistor 75. Thereby, both transistors 72 and 74 drive current, respectively, through the resistor 73 and the recall pin of memory 34 and resistor 75, and reset terminal of computer 32 in response to the signals at terminal A and port 35 of computer 32. The resistor 76 connected from the +5 V supply to the anode of diode 70 provides the base current for transistors 72 and 74 when transistor 64 and P35 of the computer are off. The RECALL signal, seen in the sixth trace of FIG. 4, has a leading edge which is delayed from the leading edge of the reset signal of the fourth trace by the time it takes computer 32 to execute the initialization program to the point where it makes P35 low.

The transfer circuit 38 further comprises complemented AND gates 84, 86, 88, and 90, complemented OR gates 92 and 94, digital inverters 96, 98 and 100, and a resistor 102. These elements serve as a gating circuit for generating logic signals for controlling the READ AND WRITE signals for operation of the memories 34 and 36 by the computer 32.

The operation of the foregoing gating circuitry is as follows. All terminals of the AND gate 84 are complemented, one input terminal being coupled to Port 13 of the computer 32 for receiving an output signal thereof. The second input terminal of the gate 84 connects with the output terminal of the inverter 68, the output terminal of the gate 84 connecting with the STORE terminal of the memory 34. The complementing of the terminals of the gate 84 provide for the complemented value of the STORE signal to the memory 34.

The signal at Port 13 is also connected to an input terminal of the gate 86 and to an input terminal of the inverter 100. The complement of the WRITE signal at Port 36 of the computer 32 is applied to the WRITE ENABLE terminal of the memory 34, and is also applied to input terminals of the gates 88 ansd 92. The complemented value of the READ signal at Port 37 of the computer 32 is applied to a second input terminal of the gate 92, the output terminal thereof being connected to the second input terminal of the gate 86 as well as to an input terminal of the gate 90.

The output terminal of the gate 86 connects with the CHIP ENABLE terminal of the memory 34, all terminals of the gate 86 being complemented to provide for the complementary value of the CHIP-ENABLE signal to the memory 34. A bus connects Ports 14 and 15 of the computer 32, respectively, with the two input terminals of the complemented OR gate 94, the signal at Port 14 also being connected to the input terminal of the inverter 96. Representative waveforms of the signals at ports 14 and 15 of the computer 32 are shown in the bottom trace of FIG. 4. Thus, the bus contains two wires, as indicated by the numeral 2 set adjacent the bus, the two wires providing the aforementioned connection. The output terminal of the gate 94 connects with an input terminal of the inverter 98 and with a second input terminal of the gate 88. The terminals of the gate 88 are complemented to provide the complemented value of a WRITE-ENABLE signal to the EEPROM 36. The gate 90 similarly provides a complemented value of the CHIP-ENABLE signal to the memory 36, the input terminals of the gate 90 connecting, respectively, with the output terminal of the gate 92 and an output terminal of the inverter 100.

The two inverters 96 and 98 provide two CHIP-ENABLE signals at terminals C1 and C0 terminals of the memory 36 for provision of control signals which control the mode of operation of the memory 36. In particular, it is noted that with respect to the two terminals C1 and C0, respectively, a logic 1 and a logic 0 command a BLOCK ERASE, two logic 1 signals command a WORD ERASE, two logic 0 signals command a READ mode and logic 0 and a logic 1 signals command a WRITE mode.

The interconnection of the signals of Ports 14 and 15 of the computer 32 via the complemented OR gate 94 provides for a safety feature in which a logic 0 and a logic 1, from Ports 14 and 15, is converted to a harmless READ signal (00) at the output terminals of the inverters 96 and 98, instead of the BLOCK ERASE (10) signal. The resistor 102 serves as a pull-up resistor for establishing the desired amplitude of the high voltage which represents a logic 1 signal. Similar resistors (not shown) are utilized at the other terminals of the memory 36, in a well-known fashion, for insuring that the voltages produced by the gating circuit are adequately high for the reliable operation of the memory 36.

Connection of data between the computers 32, the memory 34 and the memory 36 is accomplished by means of buses 104 and 106, the bus 104 providing data while the bus 106 provides addresses for the reading out of data of the memories 34 and 36 and for writing of data into the memories 34 and 36. The data bus 104 is portrayed as having four lines, each of which connects between the computer 32, the memory 34 and the memory 36. With respect to the address lines of the bus 106, there are ten lines exiting the computer 32, all of these ten lines being applied to the memory 36 at terminal $V_{GG}$ while only eight of these lines are applied to the memory 34. This is in accord with the storage capacities of the respective memories 36 and 34.

Operation of the memory 36 requires the use of a voltage at terminal $V_{GG}$ which, in the case of the memory 36 utilized in the preferred embodiment of the invention, has a value of −30 volts to accomplish the erase and write functions. In the absence of this voltage, data contained within the memory 36 cannot be erased and new data cannot be written. Accordingly, the transfer circuit 38 further comprises a resistor 108, a diode 110, a zener diode 112, two transistors 114 and 116 and resistors 118 and 120. In regard to the connection of the resistor 108 to the terminal C0 of the memory 36, it is noted that both the WORD ERASE and WRITE mode require a logic 1 signal at the C0 terminal. The presence of the foregoing logic 1 signal in combination with a logic 0 signal at Port 35 of the computer 32 introduces a state of conduction in the transistor 144. This is because pin 35 is connected to the base terminal thereof while the resistor 108 connects with the emitter terminal thereof.

The resulting flow of current through the collector terminal of the transistor 114 enters the base terminal of the transistor 116 to flow via the emitter terminal thereof to a source of relatively low voltage (an examplary −36 volts being shown in FIG. 3) provided by the power supply 40. The collector current in the transistor 116 flows from a source of positive voltage (+5 volts being shown in FIG. 4, by way of example) with the result that, during conduction of the resistor 116, the voltage at the collector terminal of the transistor 116 drops to a sufficiently low value to enable the functions of altering the data contained in the memory 36. In the absence of conduction through the transistor 116, the voltage at the collector rises by virtue of the connection with the resistor 118.

The collector terminal of the transistor 116 connects directly to the $V_{GG}$ terminal of the memory 36. The diode 110 is connected for the flow of current in the forward direction thereof while the zener diode 112 is back-biased to serve as a voltage reference. This permits the source of low voltage to be an unregulated source. The use of the zener diode 112, in combination with the transistor 114, provides the function of a regulated power supply. Thus, in accordance with undulations in the voltage of the power supply, the current through the transistor 116 is varied so as to maintain a substantially constant value of voltage at the terminal $V_{GG}$.

By viewing the operation of the transfer circuit 38, the output voltage of the computer 32 at Port 13 is shown in the seventh trace, with an exemplary $V_{GG}$ signal being shown in the eighth trace. All of the traces of FIG. 4 are in temporal registration with each other so as to portray the temporal relationships among the various signals. The ninth trace shows the CHIP-ENABLE signal for the EEPROM 36, while the corresponding CHIP-ENABLE signal to the memory 34 is shown in the tenth trace. The STORE signal for the memory 34 is shown in the eleventh trace.

During the normal operation of the postage meter 20, the transistor 64 is conducting and a logic 0 signal is present at terminal A. Upon a power failure, the unregulated voltage provided to the power supply 40 begins to drop. Due to the operation of the amplifier 46, the voltage at terminal A suddenly rises to a logic 1 state, this occurring well before a drop off in output voltages provided by the supply 40. As a result, the INTERRUPT signal for the computer 32 is activated, at which time there is a logic 0 signal on Port 13 for activation of the CHIP-ENABLE signal for the memory 34. As a result of the logic states of the signals at the INTERRUPT terminal and at the Port 13, the gate 84 generates the store signal in the memory 34 which strobes the memory 34 to transfer data from the volatile RAM section thereof to the non-volatile permanent-storage section of the memory 34.

The INTERRUPT signal forces computer 32 to execute an interrupt subroutine. The instructions in this subroutine makes computer 32 perform the following functions for an orderly powering down of the meter. Port 13 is changed from 0 to 1 thus terminating the STORE pulse to memory 34. This blocks via gate 86 any further enabling of memory 34 and allows via inverter 100 and gate 90 the enabling of memory 36. By suitably controlling ports 14, 15, 36, 37 and the ports for the address and data lines, the data to be preserved from the RAM contained in computer 32 is transferred into the EEPROM memory 36. Also, the Port 35 is changed from 0 to 1. If the power came back up while the computer was writing EEPROM memory, then the collector of transistor 64 is low preventing the application of a reset signal to the computer 32 via transistor 74. This is carried out after testing the INTERRUPT pin to verify that power has returned since the computer may jump to the power up or initialization routine.

If the power remains off and, therefore, the collector of transistor 64 is high when Port 35 goes high, then the reset signal is applied to the computer 32 via transistor 74. The computer 32 forces all ports to the high state when it is reset thereby blocking the operation of the memories.

When power is turned on, the +5 V output from power supply 40 appears tracking the unregulated input voltage with a 2 to 3 Volts differential. This voltage rise causes capacitor 80 to charge supplying base current to transistor 74. This also causes the voltage at the RESET pin of computer 32 to track the +5 V supply voltage with a small differential. Since a high logic level at the RESET pin of computer 32 causes the computer to remain in the reset state and forces all I/O PORTS to the high state, PORT 35 is also high and the transistors 72 and 74 are on. Therefore, shadow RAM memory 34 receives a RESTORE signal and the computer 32 a RESET signal as long as it takes the unregulated voltage input to rise from the level when the +5 V output reached its nominal level to such a level as to make voltage comparator 46 switch state.

The RESTORE signal applied to shadow RAM memory 34 causes data stored in the permanent storage section of the memory to be transferred to the RAM section of the same memory 34. When the unregulated voltage reaches the required level, voltage comparator 46 changes state and through the opto-coupler (such as a combination of light emitting diode 52 and phototransitor 56), places transistor 64 in conduction. The collection of transistor 64 pulls, through diode 70, the base and, consequently, the emitter of transistor 74 low. This removes the RESET signal from computer 32 which initiates execution of a initialization routine. Among other functions, computer 32 changes the Port 35 output from 1 to 0 and thereby blocks the application of a RESET signal when the power goes down.

The computer program also initiates the operation of the computer to address the commonly stored data in the memories 34 and 36 and to compare the two portions of stored data. Such addressing, with the corresponding flow of data from the memories into the computer, is in accordance with the foregoing description of the operation. Thereby, in accordance with the invention, the computer commands the transfer of data from volatile to non-volatile storage at the initial stages of a power failure, the computer further commanding the comparison of data stored in the two memories upon power-up to insure that the storage of the data during the power failure has been faultless.

Further, with respect to the operation of the memories 34 and 36, it is noted that a WRITE command also requires the implementation of the CHIP-ENABLE signal. The use of both lines provides protection against an unintentional alteration of stored data. With respect to the memory 34, the recalling of data from the non-volatile storage to the volatile storage is achieved by the hardware while the computer 32 is in the reset state. The transfer of data from the volatile section to the non-volatile section requires the combination of a logic 0 signal on pin 13 of the computer 32 as well as a logic 0 signal provided by the inverter 68. Thus, as shown in the sixth and eleventh traces of FIG. 4, the recall and store signals are obtained, respectively, preceeding the removal of RESET and following the application of power-down INTERRUPT signals to computer 32. By way of example, in the construction of the preferred embodiment of the invention, an INTEL 8051 computer may be used, this being a microcomputer. Typical values of the capacitance of the capacitor 80 and the resistance of the resistor 76 are, respectively, 0.1 picofarads and 3000 ohms. Typical values for the resistors 108, 118 and 120 are, respectively, 2.4 kilohms, 36 kilohms and 5.6 kilohms.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. In a postage meter incorporating a computer for the computation of available postage and a non-volatile electronically-programmable READ-ONLY memory (EEPROM) for the processing of data, a security system comprising:

a shadow RAM formed as a composite memory unit including a first section of storage cells structured as a volatile random-access memory (RAM) coupled to said computer for use in computations performed by said microprocessor, said composite memory unit including a second memory section structured as a non-volatile array of storage cells arranged in correspondence with cells of the RAM, said composite memory unit further comprising means responsive to strobe signals for simultaneously transferring data between corresponding cells of said first and said second sections for permanent storage of data of said RAM during a power outage and includes means for initializing said RAM subsequent to a power outage;

means for entering data into said shadow RAM and said EEPROM;

a transfer circuit including a detector of input power, said transfer circuit including strobe means responsive to a signal of said detector for strobing said composite memory unit and said computer; and wherein said data is transferred from said volatile section to said non-volatile section at the beginning of a power outage upon a first said strobe signal, and, upon a second said strobe signal appearing at power restoration, the data is recalled from said non-volatile section within said shadow RAM; wherein said computer will write data to be preserved into the said EEPROM at the beginning of a power outage upon said first strobe signal, and, upon power restore to ON will read the data from the EEPROM into a further RAM contained in said computer and said computer compares said portion of data in said further RAM with the corresponding data being stored in said shadow RAM.

2. A data security system for a postage meter according to claim 1 wherein said transfer circuit further comprises means coupled to said EEPROM for preventing a bulk erase of data therein.

3. A security system for a postage meter according to claim 1 wherein said transfer circuit further comprises voltage regulation means for controlling voltage to said EEPROM to prevent accidental alteration of data contained therein.

4. A security system for a postage meter according to claim 1 wherein operation of said computer is controlled by an INTERRUPT signal and a RESET signal, said transfer circuit comprising means for activating said RESET signal upon a restoration of said power.

5. A security system for a postage meter according to claim 4 wherein said computer includes means for blocking the application of the RESET signal by said transfer circuit to the said computer to prevent loss of control by said computer upon occurrence of a power outage.

* * * * *